(12) United States Patent
Gajanana et al.

(10) Patent No.: US 12,401,357 B2
(45) Date of Patent: Aug. 26, 2025

(54) AREA EFFICIENT BIDIRECTIONAL SWITCH WITH OFF STATE INJECTION CURRENT CONTROL

(71) Applicant: NEXPERIA B.V., Nijmegen (NL)

(72) Inventors: Deepak Gajanana, Nijmegen (NL); Gim Heng Tan, Penang (MY)

(73) Assignee: NEXPERIA B.V., Nijmegen (NL)

( * ) Notice: Subject to any disclaimer, the term of this patent is extended or adjusted under 35 U.S.C. 154(b) by 103 days.

(21) Appl. No.: 18/451,283

(22) Filed: Aug. 17, 2023

(65) Prior Publication Data
US 2024/0072786 A1 Feb. 29, 2024

(51) Int. Cl.
*H03K 17/06* (2006.01)
*H03K 17/687* (2006.01)
*H03K 19/003* (2006.01)
*H03K 19/173* (2006.01)

(52) U.S. Cl.
CPC ....... *H03K 17/063* (2013.01); *H03K 17/6872* (2013.01); *H03K 19/00315* (2013.01); *H03K 19/1737* (2013.01)

(58) Field of Classification Search
None
See application file for complete search history.

(56) References Cited

U.S. PATENT DOCUMENTS

| 9,444,451 B2 * | 9/2016 | Sato | H03K 17/6872 |
| 9,966,911 B2 * | 5/2018 | Morris | H03F 3/45179 |

FOREIGN PATENT DOCUMENTS

EP    4 009 523 A1    6/2022

* cited by examiner

*Primary Examiner* — Kenneth B Wells
(74) *Attorney, Agent, or Firm* — Ruggiero McAllister & McMahon LLC (57) ABSTRACT

A transmission unit including a transmission switch and an injection current control circuit is provided. The transmission switch includes a plurality of n-MOS and p-MOS transistors connected to one another in parallel, and the injection current control circuit includes an injection current detection circuit that is arranged for being activated upon detection of an injection current in an output side or an input side of the transmission unit, the transmission unit further includes a bypass circuit arranged for being activated by the injection current detection circuit and further arranged for bypassing the injection current to a ground upon detection of the injection current. A multiplexer, and demultiplexer including such a transmission unit is also provided herein.

19 Claims, 5 Drawing Sheets

AREA EFFICIENT BIDIRECTIONAL SWITCH WITH OFF STATE INJECTION CURRENT CONTROL

CROSS-REFERENCE TO RELATED APPLICATIONS

This application claims the benefit under 35 U.S.C. § 119(a) of European Application No. 22191655.4 filed Aug. 23, 2022, the contents of which are incorporated by reference herein in their entirety.

BACKGROUND

1. Field of the Disclosure

The present disclosure generally relates to power Metal Oxide Semiconductor Field Effect Transistors, MOSFETs, and more particularly to circuits for negating effects of injection current in a transmission switch in its OFF state.

2. Description of the Related Art

The transmission gate or the so-called pass gate switch is an efficient way to switch signals. Some well-known features are inclusion of half width transistors on either side controlled by the inverted phase of the clock to overcome charge injection effects and clock feedthrough effects. These effects are primarily observed when the switch is in transmission mode or on state.

To control the timing of the switch and to turn on a NMOS transistor and a PMOS transistor with equal delay, another small inverter and a transmission gate is used on the enable signal.

During off state, the switch interfaced to external sensors or other circuitry could possibly experience current or charge injection, both positive and negative, from external sources. This current injection leads to crosstalk or noise on a shared output as in a multiplexer or otherwise. Moreover, current injection could affect the supply voltage leading to change in on state resistance of other switches powered by the same supply or even detriment the performance of another circuit powered by the same supply. It is highly desirable to negate this charge injection effect when the transmission gate is in OFF state.

EP 4 009 523 A1 discloses a multi-branch analog multiplexer (anamux) which includes protection circuitry to help dissipate both positive and negative injected current without increasing the size of hardening transistors in each branch, thereby avoiding increased leakage current and enabling an analog to digital converter to operate with the required accuracy.

SUMMARY

A summary of aspects of certain examples disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects and/or a combination of aspects that may not be set forth.

In a first aspect of the present disclosure, there is presented a transmission unit comprising a transmission switch and an injection current control circuit, wherein said transmission switch comprises a plurality of n-MOS and p-MOS transistors connected to one another in parallel, wherein said injection current control circuit comprises an injection current detection circuit that is arranged for being activated upon detection of an injection current in an output side or an input side of said transmission unit, said transmission unit further comprising a bypass circuit arranged for being activated by said injection current detection circuit and further arranged for bypassing said injection current to a ground upon detection of said injection current.

The transmission unit can be understood as a unit or entity connected to an input side and an output side and arranged to communicate signals or data between the two sides. The transmission switch is also known to the skilled person as a transmission gate or a gate-pass switch. In its most simple construction, a transmission gate is made up of two field-effect transistors, in which—in contrast to traditional discrete field-effect transistors—the substrate terminal (bulk) is not connected internally to the source terminal. The two transistors, an n-channel MOSFET and a p-channel MOSFET, are connected in parallel with this, however, only the drain and source terminals of the two transistors are connected together. Their gate terminals are connected to each other by a NOT gate (inverter), to form the control terminal.

Unlike with discrete FETs, the substrate terminal is not connected to the source connection. Instead, the substrate terminals are connected to the respective supply potential in order to ensure that the parasitic substrate diode (between source/drain and substrate) is always reversely biased and so does not affect signal flow. The substrate terminal of the p-channel MOSFET is thus connected to the positive supply potential, and the substrate terminal of the n-channel MOSFET is connected to the negative supply potential.

In the transmission switch according to the present disclosure, at least two sets of n-MOSFET and p-MOSFET may be employed to achieve the results as disclosed. The actual setup as employed is further elaborated in the present application in the description of the figures.

Transmission switches are most commonly employed in multiplexers and as electronic switches. Especially when being employed in multiplexers, it is important that the transmission switch maintains its position in the off state or the on state constantly. Particularly important is maintenance of the transmission switch in the off state. Typically in multiplexers, only 1 among, for example 8 channels, is activated. The others are all in an off state. In such a scenario, if any one of the channels which are currently in the off state become on, it can lead to a wrong output.

Such a scenario could occur because of injection currents. Injection current is the current that is being forced into a pin by an input voltage higher than the positive supply or lower than ground. The current flows through the input protection diodes into whichever supply is being exceeded. Ideally, all inputs would be limited to the supply voltages, but the chip can tolerate small excursions above and below as long as the current isn't high enough to damage or disrupt the rest of the circuit.

As a result of its interaction with the rest of the circuit or due to small disturbances in the circuit, injection currents may be introduced in the circuit. These injection currents may cause a transmission switch in its off state to change to an ON state-thereby causing an error in the desired output. The injection currents may be classified as either being positive or negative. A positive injection current results when the source voltage exceeds the nominal voltage, thereby creating a potential difference which causes a current to flow into the device—in this case the transmission switch.

A negative injection current results when the voltage at the node of the device exceeds the source voltage, or when the source voltage falls below the nominal voltage causing a current to flow out of the device towards the source. Such a current may also cause one or more MOSFETS in the transmission gate switch to turn ON inadvertently. The skilled person understands that this phenomenon, i.e. positive and negative injection current, may occur both on the input side of the switch as well as the output side of the switch.

The externally injected current usually takes the least resistance path which most likely includes parasitic body diode paths to supply or sometimes even output and hence affects all other circuits connected to the same power supply or other circuits/channels connected to the same output leading to poor isolation or large crosstalk. Diverting all injection currents to ground irrespective of its direction, using minimal circuitry, thereby making it area efficient, during the off state of the switch, is the strength of the present disclosure.

The inclusion of a conduction path to ground for the injection current irrespective of the injection current flow direction without affecting the power supply voltage or output hence results in lower cross talk, better isolation and better on resistance stability of other channels when the channel/switch is in off state while maintaining the bidirectionality of the switch.

According to an exemplary embodiment, the bypass circuit for a positive injection current is different from a bypass circuit for a negative injection current. Such a setup ensures that based on the nature of the injection current, the transmission unit is always capable of ensuring that the injection current is always bypassed to the ground and does not inadvertently turn ON or affect the performance of any component within the circuit.

According to an embodiment, the injection current detection circuit is arranged to activate one or more of the plurality of n-MOS and p-MOS transistors upon detection of a positive injection current such that a path between a source and a ground is formed. As an example, the bypass circuit for bypassing a positive injection current may consist of a set of n-MOS and p-MOS transistors. The skilled person understands that the switches may be activated in such a way that the injection current is bypassed to the ground taking the path of least resistance. The bypass circuit should not form or provide a connection between the input and the output side.

According to an exemplary embodiment, the injection current detection circuit detects a negative injection current and the bypass circuit provides a path through the body diodes of the plurality of n-MOS or p-MOS transistors. It may be advantageous to form a bypass path that constitutes the body diodes of the transistors involved in the transmission switch. This avoids the need for making use of additional components which in turn reduces the area of the transmission unit as a whole.

According to an embodiment, the injection current detection circuit is arranged for being latched to an ON state thereby activating said bypass circuit until an enable signal de-latches said injection current detection current. The inventors consider it advantageous to ensure that the bypass circuit stays activated until a point that a dedicated signal de-latches the injection current detection circuit. When the injection current detection circuit is de-latched, the bypass circuit will also be deactivated. An enable signal is usually provided to activate the transmission switch in order to ensure that the switch is turned on, thereby transmitting the signal at the input side to its output side. The same enable signal may be used for de-latching the injection current detection circuit and thereby deactivating the bypass circuit.

According to an example, the transmission switch comprises two p-MOS transistors and two n-MOS transistors wherein the gates of the p-MOS transistors are arranged to be driven by the injection current detection signal, and the gates of the n-MOS transistors are arranged to be driven by an enable signal.

According to an example, the transmission unit comprises a further active switching element in the bypass circuit that is arranged to be enabled as a result of detection of an injection current. As an example, the active switch may be arranged to be enabled upon detection of either a positive or a negative injection current on any of an input or output side of the transmission unit.

According to an example, the bypass circuit comprises one or more of said n-MOS or p-MOS transistors forming said transmission switch. It is understood that the transistors that form the transmission switch may be utilized to create a temporary path to a ground for the injection current. This may be formed by selectively activating one or more n-MOS or p-MOS transistors such that a path to ground of least resistance is formed. The skilled person understands that when the one or more transistors are activated, they should be activated in such a manner that a direct path between the input and output is not formed.

In a second aspect of the present application, there is presented a multiplexer comprising one or more of said transmission unit according to the first aspect of the present disclosure.

In a third aspect of the present application, there is presented a demultiplexer comprising one or more of said transmission unit according to the first aspect of the present disclosure.

It is noted that the definitions and advantages associated with the first aspect of the present disclosure being a transmission unit are also associated with the second and third aspects of the present disclosure being a multiplexer and a de-multiplexer, respectively.

Figure 3:
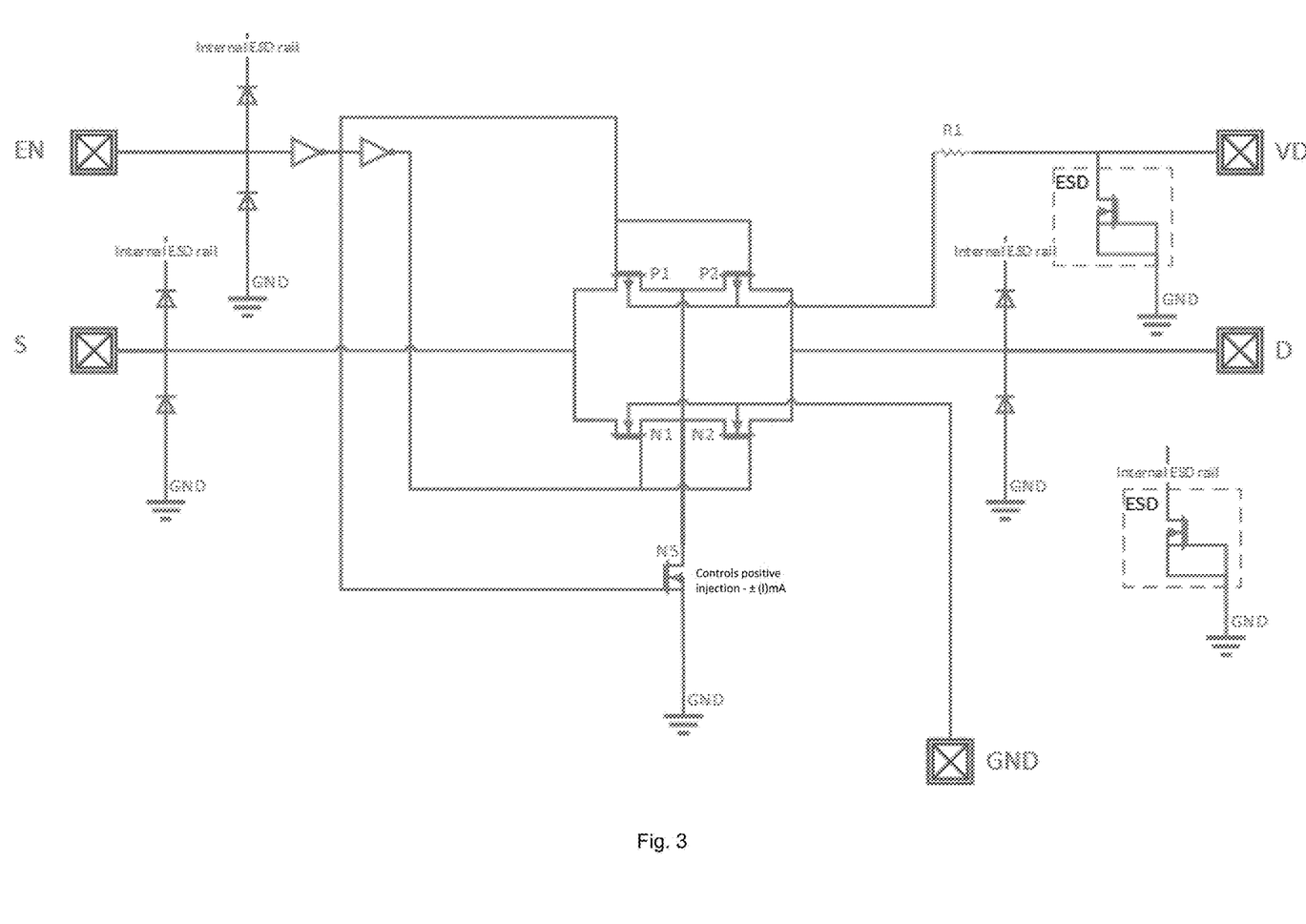
FIGS. 3, 4 and 5 illustrate different examples of a transmission unit.
Figure 4:
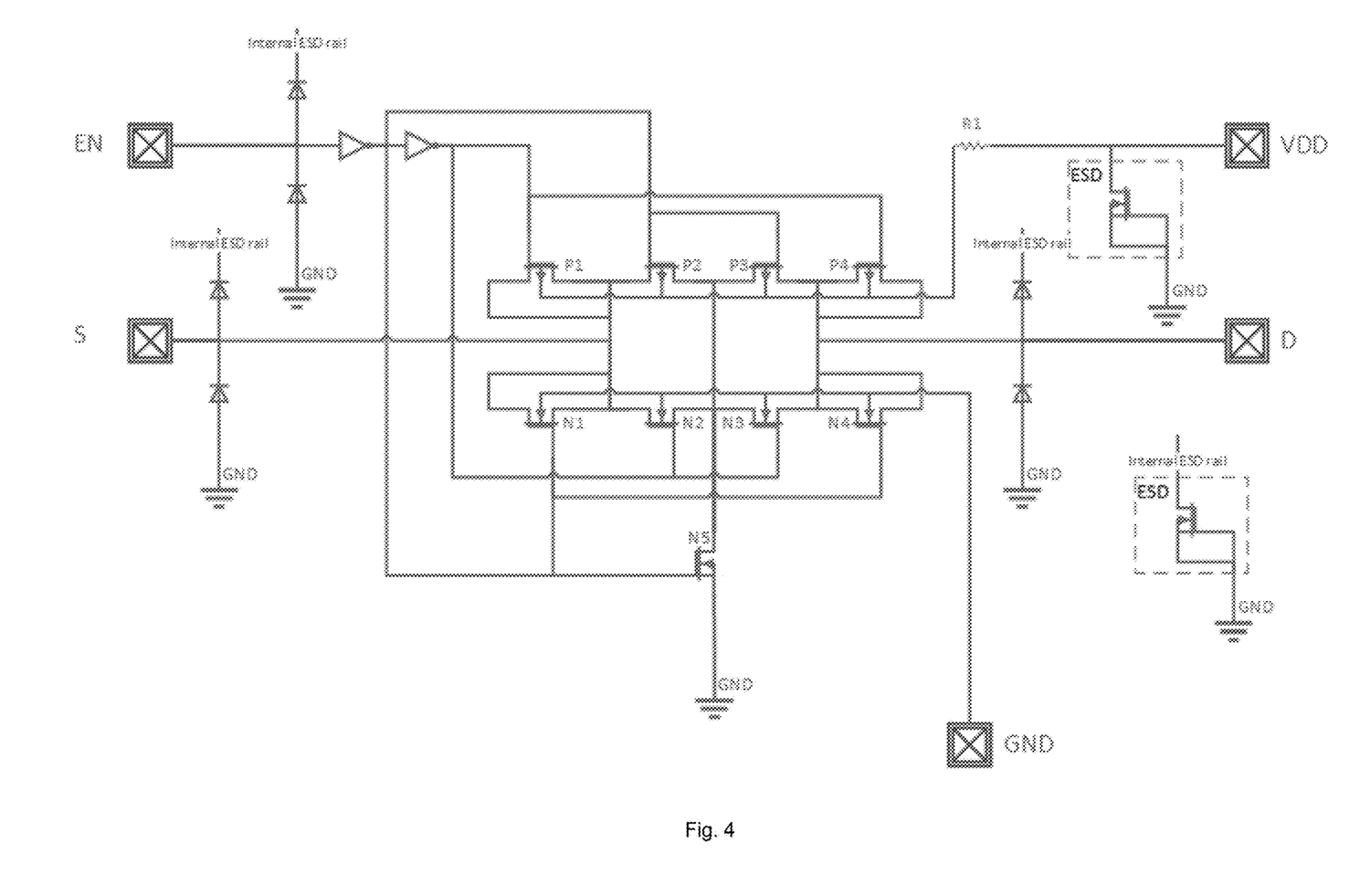

Other embodiments that achieve the same function may be considered by the skilled person. Such embodiments may involve CMOS processing technology related design arounds, circuit based design arounds or a combination of the two. Technology related design arounds demand use of twin well based process and/or use of truly isolated transistors where the bulk could be connected to source and use low-VT based implants to reduce the threshold voltage of the transistors. Circuit based design around could be based on changing the ESD network to the so called rail based ESD network, as shown in FIGS. 3 and 4, instead of using GGNMOS as shown. Other circuit based technique could be eliminating the short between the drains of P1, P2, N1 and N2 and instead using a different route to conduct the injection current, an example being use of another PMOS transistor and a NMOS transistor to ground or using another PMOS transistor to the drain of N5.

The present disclosure is described in conjunction with the appended figures. It is emphasized that, in accordance with the standard practice in the industry, various features are not drawn to scale. In fact, the dimensions of the various features may be arbitrarily increased or reduced for clarity of discussion.

In the appended figures, similar components and/or features may have the same reference label. If only the first reference label is used in the specification, the description is applicable to any one of the similar components having the same first reference label irrespective of the second reference label.

The above and other aspects of the disclosure will be apparent from and elucidated with reference to the examples described hereinafter.

DETAILED DESCRIPTION

It is noted that in the description of the figures, the same reference numerals refer to the same or similar components performing a same or essentially similar function.

A more detailed description is made with reference to particular examples, some of which are illustrated in the appended drawings, such that the manner in which the features of the present disclosure may be understood is provided in more detail. It is noted that the drawings only illustrate typical examples and are therefore not to be considered to limit the scope of the subject matter of the claims. The drawings are incorporated for facilitating an understanding of the disclosure and are thus not necessarily drawn to scale. Advantages of the subject matter as claimed will become apparent to those skilled in the art upon reading the description in conjunction with the accompanying drawings.

The ensuing description provides preferred exemplary embodiment(s) only, and is not intended to limit the scope, applicability or configuration of the disclosure. Rather, the ensuing description of the preferred exemplary embodiment(s) will provide those skilled in the art with an enabling description for implementing a preferred exemplary embodiment of the disclosure, it being understood that various changes may be made in the function and arrangement of elements, including combinations of features from different embodiments, without departing from the scope of the disclosure.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." As used herein, the terms "connected," "coupled," or any variant thereof means any connection or coupling, either direct or indirect, between two or more elements; the coupling or connection between the elements can be physical, logical, electromagnetic, or a combination thereof. Additionally, the words "herein," "above," "below," and words of similar import, when used in this application, refer to this application as a whole and not to any particular portions of this application. Where the context permits, words in the Detailed Description using the singular or plural number may also include the plural or singular number, respectively. The word "or" in reference to a list of two or more items, covers all of the following interpretations of the word: any of the items in the list, all of the items in the list, and any combination of the items in the list.

These and other changes can be made to the technology in light of the following detailed description. While the description describes certain examples of the technology, and describes the best mode contemplated, no matter how detailed the description appears, the technology can be practiced in many ways. Details of the system may vary considerably in its specific implementation, while still being encompassed by the technology disclosed herein. As noted above, particular terminology used when describing certain features or aspects of the technology should not be taken to imply that the terminology is being redefined herein to be restricted to any specific characteristics, features, or aspects of the technology with which that terminology is associated. In general, the terms used in the following claims should not be construed to limit the technology to the specific examples disclosed in the specification, unless the Detailed Description section explicitly defines such terms. Accordingly, the actual scope of the technology encompasses not only the disclosed examples, but also all equivalent ways of practicing or implementing the technology under the claims.

Figure 1:
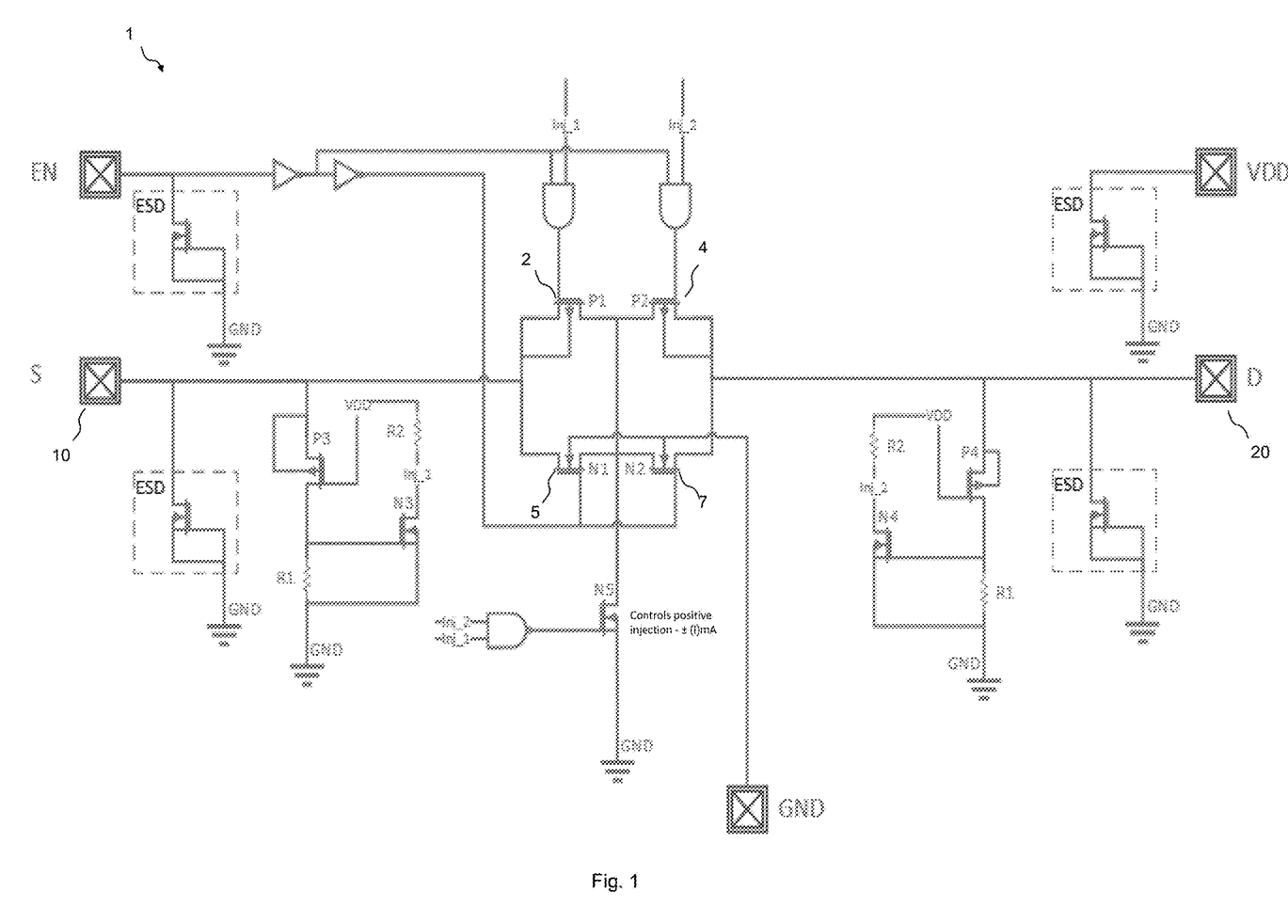
FIG. 1 illustrates an embodiment of a transmission unit according to the present disclosure.

An embodiment 1 of the current disclosure is elaborated with reference to FIG. 1, wherein a signal is to be transmitted from the Source terminal 10 to the Drain terminal 20. In the embodiment, the PMOS transistors P1, P2 are referred to using the numbers 2, 4 respectively. The numbers or the notations P1, P2 are used interchangeably in the description. Similarly, the NMOS transistors N1, N2 are referred to using the numbers 5, 7 respectively. These are also used interchangeably with the notations N1, N2 in the description.

The transmission gate comprises PMOS transistors P1, P2, NMOS transistors N1 and N2 with a short on the drains of all the 4 transistors. This common point is exploited for current injection control. The gates of N1 and N2 are driven by the buffered enable signal, while the gates of P1 and P2 are driven by the inversion of the enable signal. Therefore, when the switch is enabled, all 4 transistors P1, P2, N1 and N2 are conducting and helps reducing and controlling the on resistance of the switch. This work is regarding the reduction of the charge injection when the switch is in off mode. When the switch is turned off, meaning when signal EN is low, there could be charge or current injection from external sources on pin S. This charge or current injection could potentially affect the power supply voltage (in this case VDD) through parasitic diode paths or also through ESD diode paths and consequently affect the performance of other switches connected to the same power supply. The effects include change in on resistance, cross talk, or even variation of the output voltage on pin D. In circuits like multiplexers, where there are multiple switches present, controlled by a binary decoder and the output of all switches tied together as one output, the effects could be of significance. This work eliminates such effects by utilizing the common short point between the drains of P1, P2, N1 and N2. With such an arrangement, both the positive and negative injection currents during off state could be routed through the ground line of the circuit instead of affecting the power supply and hence nullifying all the detrimental effects mentioned before. A high ohmic resistor R1 on the bulk connection of the PMOS transistors ensures that there is minimum amount of current flowing in the supply line during current injection.

The embodiment is further described in cases of positive and negative injection current on the input side.

Current path during positive current injection:

When the switch is in off state, the gates of P1 and P2 obtain a potential of VDD and the gates of N1 and N2 are at ground potential, i.e., the transistors are in off-state cutting off the transmission path from S to D.

When there is a positive current injection from an external source, the potential on pin S rises as all parasitic diodes (body diodes of P1, P2, N1, N2) are reverse biased and there is no conduction path for the current. The potential rises until it crosses the on-threshold voltage of P3 (note that gate of P3 is already at VDD, so S rises till VDD+Vthp, where Vthp is the threshold voltage of P3), the point at which the channel of P3 is turned on and starts conducting. This turns N3 ON and pulls the gate of P1 low. Note that N5 is also on because of the NAND gate control and hence all the injection current now flows through P1 and N5 without affecting the power supply voltage.

Current path during negative current injection: When there is a negative current injection from an external source, the potential on pin S drops until it crosses the threshold voltage of N1 (note that gate of N1 was already at ground potential, so S falls until −Vthn, where Vthn is the threshold voltage of N1), the point at which the channel of N1 is turned on and starts conducting. Note that N5 is already on and hence all the injection current now flows through N1 and N5 without affecting the power supply voltage. The body diode of the GGNMOS (grounded gate NMOS) ESD transistor also conducts some amount of current during negative current injection. If the ESD safety network was rail based, there still would be a diode between S and ground, conducting some amount of current during negative current injection.

The skilled person understands that the injection current detection circuit is arranged to detect an injection current. In the embodiment shown in FIG. 1, the injection current detection circuits are arranged on either side of the transmission gate to detect injection currents (both positive and negative) on the input side as well as the output side. For example, an injection current (positive or negative) as the input side generates an Inj_1 signal and an injection current (positive or negative) on the output side generates and Inj_2 signal. By combining the two signals using a NAND gate, and providing the output of the NAND gate to the NMOS N5, the inventors ensure that a path to the ground is always created upon detection of an injection current.

The same principles could be applied and proved that any current injection on pin D will also not affect the power supply voltage or eliminate all effects making it a bidirectional switch with injection control. The skilled person understands that the same principles could be applied for detecting and bypassing an injection current on the output side.

Similarly, other methods which ensure a bypass path to the ground may be considered. For example, in FIG. 5, the n-MOS N5 is automatically activated when the enable pin EN turns low. By providing the inverted enable signal to the gate of N5, the inventors are able to ensure that in an off-state of the transmission switch, i.e. when the enable signal is low, the active switching element, N5, in the bypass path is turned ON, thereby providing a part of the path for the injection current to be bypassed to the ground. By activating one or more of the further MOSFETs, the injection current may be suitably directed towards the ground.

Figure 5:
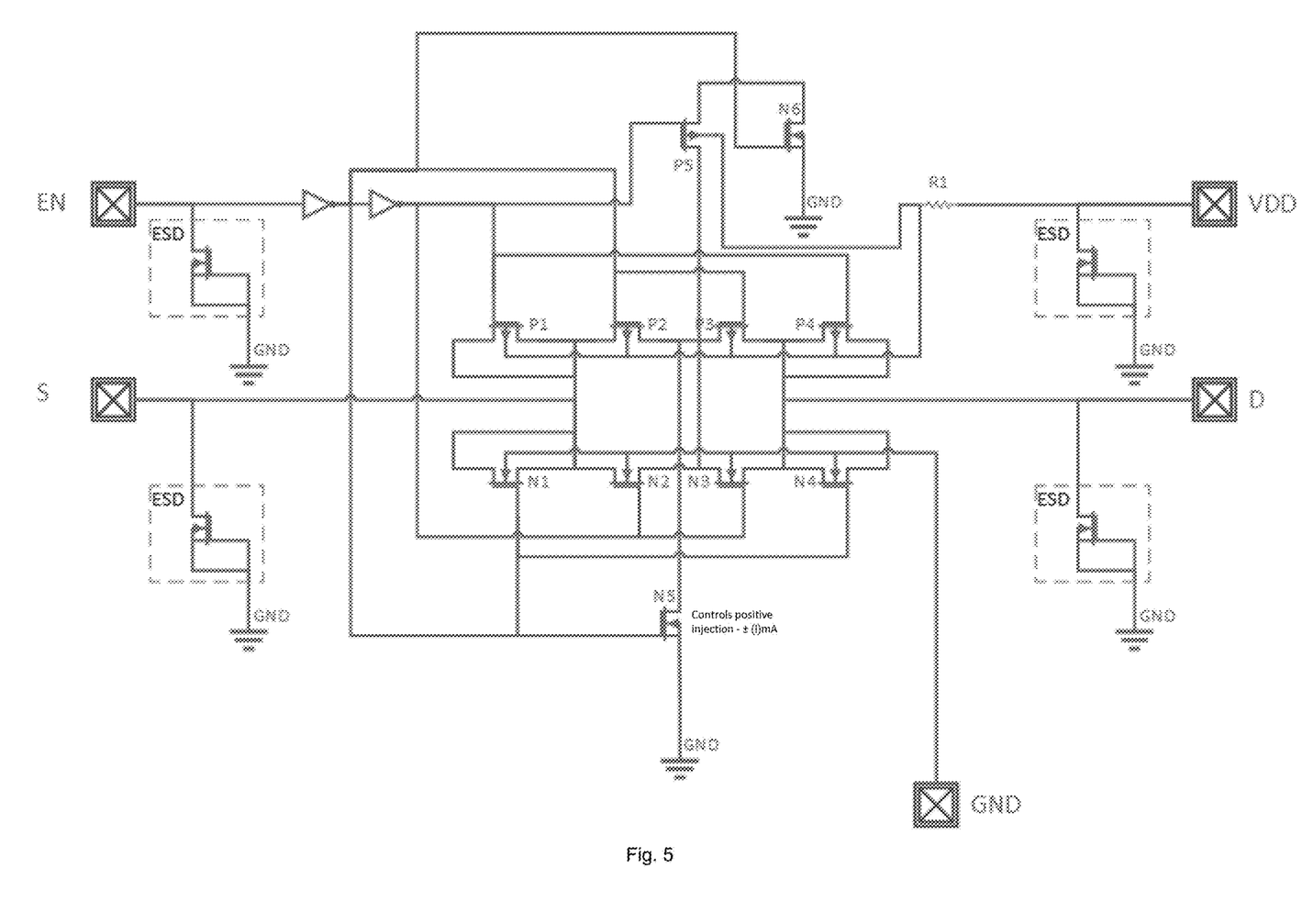

Such a construction, as shown in FIG. 5, also ensures that when the transmission switch is in an ON state, N5 is disabled and thus ensuring that there is no undesired path to the ground.

Figure 2:
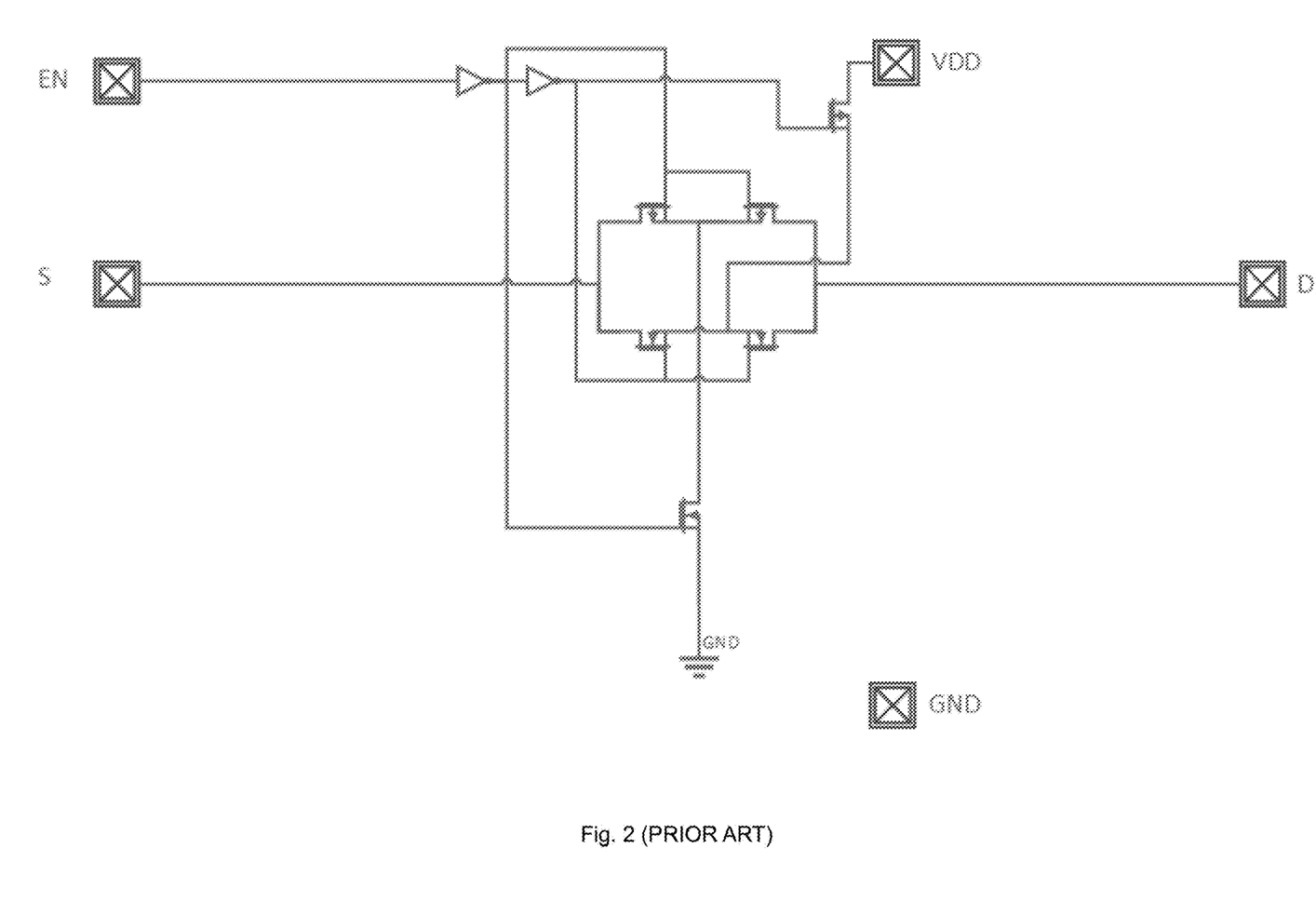
FIG. 2 illustrates a device as known in the prior art

FIG. 2 illustrates a transmission gate free of channel and clock injection errors using PMOS and NMOS. Channel and clock injection can be eliminated by using half the size (0.5*W/L) of the transmission switch on source and drain driven by the complementary clock signal. However, this particular embodiment is unable to ensure a provision of a bypass path for all injection currents, without affecting the normal operation of the device as a whole.

With reference to FIG. 5, in addition, P1 and P4 are half the width of P2 and P3 and are driven by the buffered enable signal. Also, on the other side N1 and N4 are half the width of N2 and N3 respectively and are driven by the inversion of the enable signal. Transistors P1, P4, N1 and N4 help tackle the problem of charge injection and clock feedthrough when the switch is in the on mode or in transmission mode by acting as source-drain connected capacitors, and introducing another NMOS transistor N5, whose gate is controlled by the inversion of the enable signal.

When there is a positive current injection from an external source, the potential on pin S rises as all parasitic diodes (body diodes of P1, P2, P3, P4, N1, N2, N3, N4) are reverse biased and there is no conduction path for the current. The potential rises until it crosses the P2 on threshold voltage (note that gate of P2 is already at VDD, so S rises until VDD+Vthp, where Vthp is the threshold voltage of P2), the point at which the channel of P2 is turned on and starts conducting. Note that N5 is already on and hence all the injection current now flows through P2 and N5 without affecting the power supply voltage.

When there is a negative current injection from an external source, the potential on pin S drops until it crosses the threshold voltage of N2 (note that gate of N2 was already at ground potential, so S falls until −Vthn, where Vthn is the threshold voltage of N2), point at which the channel of N2 is turned on and starts conducting. Note that N5 is already on and hence all the injection current now flows through N2 and N5 without affecting the power supply voltage. The body diode of the GGNMOS (grounded gate NMOS) ESD transistor also conducts some amount of current during negative current injection. If the ESD safety network was rail based, there still would be a diode between S and ground, conducting some amount of current during negative current injection.

The same principles could be applied and proved that any current injection on pin D will also not affect the power supply voltage or eliminate all effects, thereby making it a bidirectional switch with injection control.

LIST OF REFERENCE NUMERALS

1 Transmission Unit
2 PMOS
4 PMOS
5 NMOS
7 NMOS
10 Source, Input terminal
20 Drain, Output Terminal

What is claimed is:

1. A transmission unit comprising a transmission switch and an injection current control circuit, wherein the transmission switch comprises a plurality of n-MOS and p-MOS transistors connected to one another in parallel between an input and an output, wherein the injection current control circuit comprises:
    an injection current detection circuit that is arranged for being activated upon detection of an injection current in the output or the input of the transmission unit, wherein the injection current detection circuit comprises:
        a circuit at the input comprising a P-MOS transistor connected to the input, wherein the P-MOS transistor has a gate that is connected to a supply voltage, the circuit at the input further comprising a first resistor connected in series with an N-MOS transistor, wherein the N-MOS transistor has a gate that is connected to a drain of the P-MOS transistor and to a second resistor, wherein the N-MOS transistor has a source that is connected to an end of the second resistor and to ground, and wherein the N-MOS transistor has a drain that forms an activation for a bypass circuit, and/or a circuit at the output comprising a P-MOS transistor connected to the input, wherein the P-MOS transistor has a gate that is connected to a supply voltage, the circuit at the output further comprising a third resistor connected in series with an N-MOS transistor, wherein the N-MOS transistor has a gate that is connected to a drain of the P-MOS transistor and to a fourth resistor, wherein the N-MOS transistor has a source that is connected to an end of the fourth resistor and to ground, and wherein the N-MOS transistor has a drain that forms an activation for a bypass circuit, and wherein the transmission unit further comprises a bypass circuit arranged for being activated by the injection current detection circuit and further arranged for bypassing the injection current to a ground upon detection of the injection current; and wherein drains of the plurality of n-MOS and p-MOS transistors are shorted, and wherein the bypass circuit is arranged for bypassing the injection current to the ground, by providing a current path from the drains to the ground.

2. The transmission unit according to claim 1, wherein the bypass circuit for a positive injection current is different from a bypass circuit for a negative injection current.

3. The transmission unit according to claim 1, wherein the injection current detection circuit is arranged for being latched to an ON state thereby activating the bypass circuit until an enable signal de-latches the injection current detection current.

4. The transmission unit according to claim 1, wherein the transmission switch comprises two p-MOS transistors and two n-MOS transistors, and wherein the gates of the p-MOS transistors are arranged to be driven by the injection current detection signal, and the gates of the n-MOS transistors are arranged to be driven by an enable signal.

5. The transmission unit according to claim 1, wherein the bypass circuit comprises one or more of the n-MOS or p-MOS transistors forming the transmission switch.

6. The transmission unit according to claim 2, wherein the injection current detection circuit is arranged for being latched to an ON state thereby activating the bypass circuit until an enable signal de-latches the injection current detection current.

7. The transmission unit according to claim 2, wherein the transmission switch comprises two p-MOS transistors and two n-MOS transistors, and wherein the gates of the p-MOS transistors are arranged to be driven by the injection current detection signal, and the gates of the n-MOS transistors are arranged to be driven by an enable signal.

8. The transmission unit according to claim 2, wherein the bypass circuit comprises one or more of the n-MOS or p-MOS transistors forming the transmission switch.

9. The transmission unit according to claim 3, wherein the injection current detection circuit is arranged for being latched to an ON state thereby activating the bypass circuit until an enable signal de-latches the injection current detection current.

10. The transmission unit according to claim 3, wherein the transmission switch comprises two p-MOS transistors and two n-MOS transistors, and wherein the gates of the p-MOS transistors are arranged to be driven by the injection current detection signal, and the gates of the n-MOS transistors are arranged to be driven by an enable signal.

11. The transmission unit according to claim 3, wherein the bypass circuit comprises one or more of the n-MOS or p-MOS transistors forming the transmission switch.

12. The transmission unit according to claim 4, wherein the injection current detection circuit is arranged for being latched to an ON state thereby activating the bypass circuit until an enable signal de-latches the injection current detection current.

13. The transmission unit according to claim 4, wherein the transmission switch comprises two p-MOS transistors and two n-MOS transistors, and wherein the gates of the p-MOS transistors are arranged to be driven by the injection current detection signal, and the gates of the n-MOS transistors are arranged to be driven by an enable signal.

14. The transmission unit according to claim 4, wherein the bypass circuit comprises one or more of the n-MOS or p-MOS transistors forming the transmission switch.

15. The transmission unit according to claim 4, further comprising a further active switching element in the bypass circuit that is arranged to be enabled as a result of detection of an injection current.

16. A multiplexer comprising at least one transmission unit according to claim 1.

17. A demultiplexer comprising at least one transmission unit according to claim 1.

18. A multiplexer comprising at least one transmission unit according to claim 2.

19. A demultiplexer comprising at least one transmission unit according to claim 2.

* * * * *